(12) United States Patent
Wang et al.

(10) Patent No.: US 12,215,414 B2
(45) Date of Patent: *Feb. 4, 2025

(54) SHUTTER DISC FOR A SEMICONDUCTOR PROCESSING TOOL

(71) Applicant: Taiwan Semiconductor Manufacturing Company, Ltd., Hsinchu (TW)

(72) Inventors: Yi-Lin Wang, Kaohsiung (TW); Chin-Szu Lee, Taoyuan (TW); Hua-Sheng Chiu, Zhudong Town (TW); Yi-Chao Chang, Hsinchu (TW); Zih-Shou Mue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 9 days.

This patent is subject to a terminal disclaimer.

(21) Appl. No.: 18/447,543

(22) Filed: Aug. 10, 2023

(65) Prior Publication Data

US 2023/0383397 A1 Nov. 30, 2023

Related U.S. Application Data

(63) Continuation of application No. 17/662,107, filed on May 5, 2022, now Pat. No. 11,827,970.

(Continued)

(51) Int. Cl.
*H01J 37/34* (2006.01)
*B08B 7/00* (2006.01)
(Continued)

(52) U.S. Cl.
CPC ............ *C23C 14/34* (2013.01); *B08B 7/0035* (2013.01); *B08B 17/04* (2013.01); *C23C 14/50* (2013.01);
(Continued)

(58) Field of Classification Search
CPC ............... H01J 37/3441; H01J 37/3447; H01J 37/32724; H01J 37/32853;
(Continued)

(56) References Cited

U.S. PATENT DOCUMENTS 11,827,970 B2 * 11/2023 Wang ................ H01J 37/32724
2006/0021578 A1 2/2006 Seo et al.
(Continued)

*Primary Examiner* — Rodney G McDonald
(74) *Attorney, Agent, or Firm* — Harrity & Harrity, LLP

(57) ABSTRACT

Some implementations described herein provide a shutter disc for use during a conditioning process within a processing chamber of a deposition tool. The shutter disc described herein includes a material having a wave-shaped section to reduce heat transfer to the shutter disc and to provide relief from thermal stresses. Furthermore, the shutter disc includes a deposition of a thin-film material on a backside of the shutter disc, where a diameter of the shutter disc causes a spacing between an inner edge of the thin-film material and an outer edge of a substrate support component. The spacing prevents an accumulation of material between the thin film material and the substrate support component, reduces tilting of the shutter disc due to a placement error, and reduces heat transfer to the shutter disc.

20 Claims, 9 Drawing Sheets

Related U.S. Application Data

(60) Provisional application No. 63/224,707, filed on Jul. 22, 2021.

(51) Int. Cl.
*B08B 17/04* (2006.01)
*C23C 14/34* (2006.01)
*C23C 14/50* (2006.01)
*H01J 37/32* (2006.01)

(52) U.S. Cl.
CPC .. *H01J 37/32724* (2013.01); *H01J 37/32853* (2013.01); *H01J 37/3441* (2013.01); *H01J 37/3447* (2013.01); H01J 37/32082 (2013.01); H01J 2237/332 (2013.01)

(58) Field of Classification Search
CPC .......... H01J 37/32082; H01J 2237/332; C23C 14/34; C23C 14/50; B08B 7/0035; B08B 17/04
USPC .................................................... 204/298.11
See application file for complete search history.

(56) References Cited

U.S. PATENT DOCUMENTS

| | | |
|---|---|---|
| 2014/0196848 A1 | 7/2014 | Chia et al. |
| 2023/0023914 A1 | 1/2023 | Wang et al. |

\* cited by examiner

SHUTTER DISC FOR A SEMICONDUCTOR PROCESSING TOOL

CROSS-REFERENCE TO RELATED APPLICATIONS

This application is a continuation of U.S. patent application Ser. No. 17/662,107, filed May 5, 2022, which claims priority to U.S. Provisional Application No. 63/224,707, filed on Jul. 22, 2021, and entitled "SHUTTER DISC FOR A SEMICONDUCTOR PROCESSING TOOL," the contents of which are incorporated herein by reference in their entireties.

BACKGROUND

A physical vapor deposition (PVD) tool, such as a sputtering tool (or sputter deposition tool) includes a semiconductor processing tool that performs a PVD operation within a processing chamber to deposit material onto a semiconductor substrate such as a wafer. The material may include a metal, a dielectric, or another type of material. A PVD operation (such as a sputtering operation) may include placing the semiconductor substrate on an anode in a processing chamber, in which a gas (e.g., argon or another chemically inert gas) is supplied and ignited to form a plasma of ions of the gas. The ions in the plasma are accelerated toward a cathode formed of the material to be deposited, which causes the ions to bombard the cathode and release particles of the material. The anode attracts the particles, which causes the particles to travel toward and deposit onto the semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
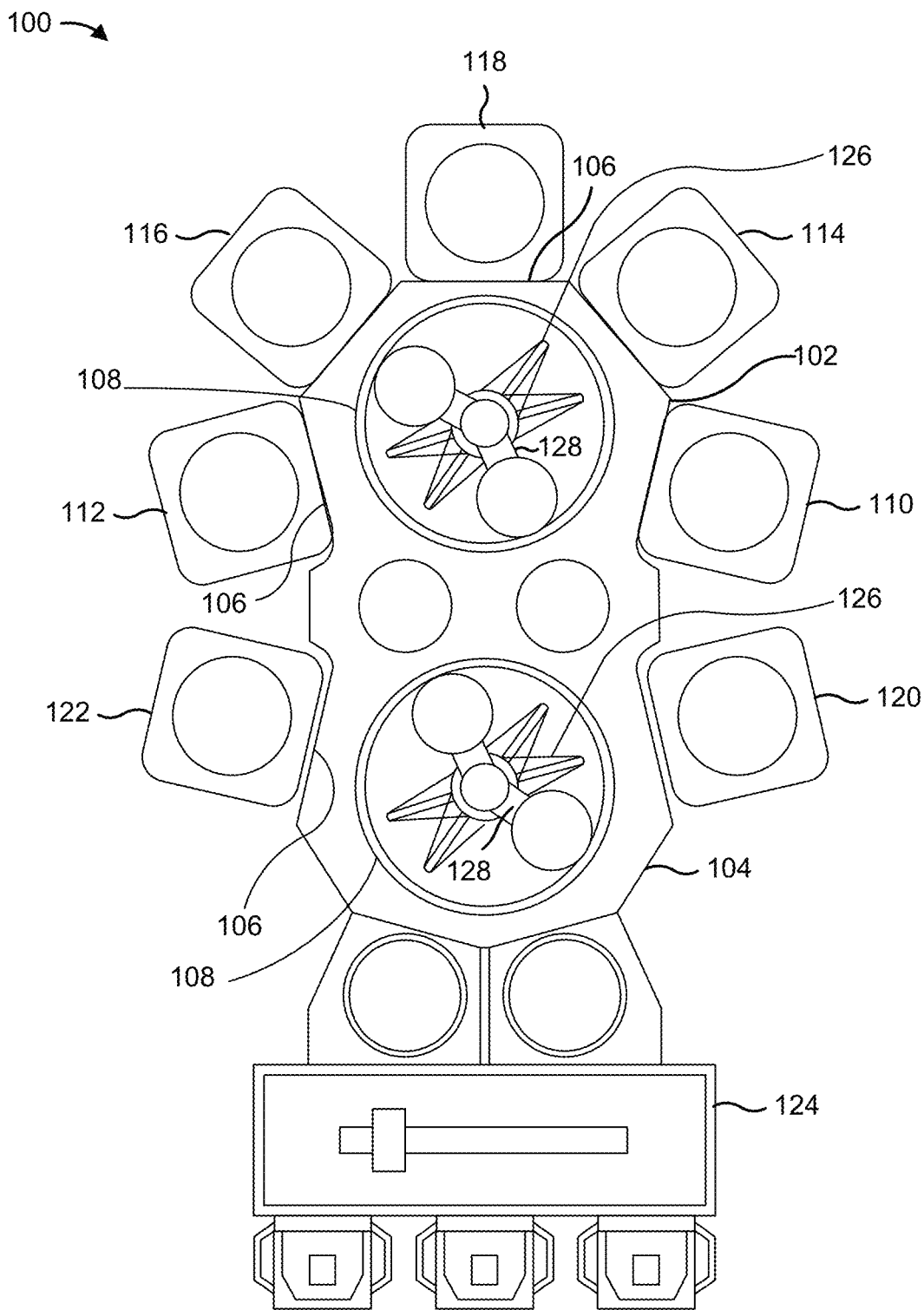
FIG. 1 is a diagram of an example semiconductor processing system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A physical vapor deposition (PVD) process may be performed in a processing chamber of a PVD tool. The PVD tool may be a standalone tool or may be included in a cluster tool or another type of semiconductor processing system that includes a plurality of processing chambers.

The processing chamber of the PVD tool may include a target and a substrate support component (e.g., a hot-plate or an electrostatic chuck, among other examples) on which a semiconductor substrate is positioned below the target. During the PVD process, material sourced from the target is deposited onto the semiconductor substrate using a plasma formed from a gas (e.g., argon or another chemically inert gas, among other examples) supplied between the target and the semiconductor substrate.

A conditioning process may be performed as a part of a maintenance process that conditions and/or cleans the target and/or surfaces of the processing chamber. The conditioning process may be performed to maintain a degree of cleanliness within the processing chamber and to maintain the performance of the PVD tool. For example, a burn-in conditioning process may be performed in which a plasma is generated within the processing chamber and is used to remove particulates (e.g., oxides or other contaminants) that have formed on the target (e.g., during downtime or idle time of the PVD tool). As another example, a pasting conditioning process may be performed to coat surfaces within the processing chamber with a thin layer of a material such as titanium to prevent flaking of underlying particulates (e.g., titanium nitride contaminants) from the surfaces.

During the conditioning process, the particulates may be deposited or transferred onto one or more exposed surfaces of the substrate support component. The particulates may subsequently cause chucking errors (e.g., errors positioning and/or securing the semiconductor substrate on the substrate support component) in a PVD operation performed by the PVD tool. Furthermore, the particulates may transfer onto a backside of the semiconductor substrate, reducing a yield of integrated circuit devices fabricated from the semiconductor substrate.

To prevent the particulates from being deposited or transferred onto the one or more surfaces of the substrate support component, the PVD tool may include a shutter disc. In operation, the shutter disc may be positioned, via a transfer robot, atop the substrate support component to prevent the particulates from being deposited or transferred onto the one or more surfaces of the substrate support component during the conditioning process.

Heat associated with the conditioning process and/or heat from a heat source that is part of the substrate support component may introduce one or more thermal stresses to the shutter disc. Such thermal stresses may cause cracking to the shutter disc, which results in the shutter disc needing to be replaced. The process to replace the shutter disc may increase a downtime of the PVD tool during maintenance (and reduce throughput of product from the PVD tool) and/or increase maintenance expenses.

Furthermore, a diameter of the shutter disc may cause a spacing between the substrate support component and a portion of a thin-film material on a backside of the shutter disc. The spacing, in turn, may reduce an effectiveness of the conditioning process and/or cause thermal stress to the shutter disc. As an example, the spacing may increase the likelihood of the thin-film material and/or particulates from the conditioning process contaminating the substrate support component. As another example, the portion of the thin-film material on the backside of the shutter disc may interfere with the substrate support component during placement of the shutter disc by a transfer robot. This may result in a tilt of the shutter disc, which enables the particulates to migrate under the shutter disc and be deposited or transferred onto the substrate support component. As another example, the portion of the thin-film material on the backside of the shutter disc may come into thermal contact with the substrate support component. In the event the thin-film material includes a material having a relatively high thermal conductivity (e.g., aluminum or another material), the thin-film material may transfer heat from the substrate support component to the shutter disc, which may cause thermal stresses and/or cracking of the shutter disc.

Some implementations described herein provide a shutter disc for use on a substrate support component in a deposition tool (e.g., a PVD tool or another type of deposition tool) during a conditioning process for the deposition tool. The shutter disc described herein includes a cross-sectional wave shape to reduce heat transfer to the shutter disc and to provide relief from thermal stresses on the shutter disc during the conditioning process. Furthermore, a width or a diameter of the shutter disc is configured to reduce, minimize, and/or prevent a likelihood of contamination of the substrate support component that might otherwise result from a thin-film material on a backside of the shutter disc and/or particulates from the conditioning process. In particular, the width or the diameter of the shutter disc may be configured to reduce, minimize, and/or prevent a likelihood of the thin-film material contacting the substrate support component, tilting of the shutter disc due to a placement error, and/or heat transfer from the substrate support component to the shutter disc, among other examples.

The wave shape of the shutter disc in combination with the width or the diameter of the shutter disc may increase an effectiveness of the shutter disc to prevent contamination of the substrate support component, and may reduce a likelihood of cracking and/or another type of physical damage to the shutter disc. In this way, effectiveness of the conditioning process is increased. This may reduce chucking errors experienced by the PVD tool, may increase a time duration between maintenance operations for the PVD tool, and/or may increase operating efficiency and throughput of the PVD tool. Furthermore, and in addition to realizing a savings in maintenance costs due to a decreased rate of shutter disc replacement, a yield of integrated circuit devices fabricated using the PVD tool may be increased due to decreased downtime and increased throughput of the PVD tool.

FIG. 1 is a diagram of an example semiconductor processing system 100 described herein. The semiconductor processing system 100 may perform a semiconductor manufacturing process, such as a PVD process (or sputtering process), a chemical vapor deposition (CVD) process, and/or another type of deposition process. The semiconductor processing system 100 may also perform a conditioning process for cleaning and/or maintenance purposes, such as a burn-in conditioning process or a pasting conditioning process, among other examples.

In some implementations, and as shown in FIG. 1, the semiconductor processing system 100 includes one or more main frames 102, 104 having a plurality of sidewalls 106. The main frames 102, 104 and the plurality of sidewalls 106 may provide structural support to the semiconductor processing system 100.

A plurality of vacuum load lock chambers 108 is located in the center of main frames 102, 104. In some implementations, one or more of the vacuum load lock chambers 108 is maintained in a vacuum state to stage semiconductor substrates for processing within the semiconductor processing system 100 to receive the semiconductor substrates after processing within the semiconductor processing system 100. Each of the plurality of vacuum load lock chambers 108 spatially separates the semiconductor substrates from processing chambers of the semiconductor processing system 100.

The semiconductor processing system 100 includes a plurality of processing chambers 110-122. Each processing chamber may include one or more components to deposit material onto a semiconductor substrate received from one of the plurality of vacuum load lock chambers 108.

An external semiconductor substrate elevator 124 is located adjacent to the semiconductor processing system 100. In some implementations, the external semiconductor substrate elevator 124 is a part of the semiconductor processing system 100. In some implementations, the external semiconductor substrate elevator 124 is a component that is separate from the semiconductor processing system 100. The external semiconductor substrate elevator 124 is configured to hold a cassette containing a plurality of semiconductor substrates (e.g., wafers). The external semiconductor substrate elevator 124 also includes an automatic distributor for selecting a semiconductor substrate from the plurality of semiconductor substrates and timely supplying the selected semiconductor substrate to one of the plurality of vacuum load lock chambers 108 to stage for processing by one of the processing chambers 110-122.

The semiconductor processing system 100 may further include, within one or more of the plurality of vacuum load lock chambers 108, a semiconductor substrate transfer system 126 including a plurality of robotic arms 128. The semiconductor substrate transfer system 126, including the plurality of robotic arms 128, may operate in conjunction with the external semiconductor substrate elevator 124 to transport semiconductor substrates amongst a cassette on the external semiconductor substrate elevator 124, and to and/or from one or more of the processing chambers 110-122.

One or more of the processing chambers 110-122 may be subjected to a conditioning process to clean the one or more of the processing chamber 110-122 and to maintain a degree of cleanliness in the one or more of the processing chamber 110-122. Examples of such a conditioning process include a burn-in conditioning process that forms a plasma to remove particulates from a target material within the one or more of the processing chambers 110-122, a pasting conditioning process that coats an interior surface within the one or more of the processing chambers 110-122 to prevent flaking of particulates from the interior surface, and/or another conditioning process.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2:
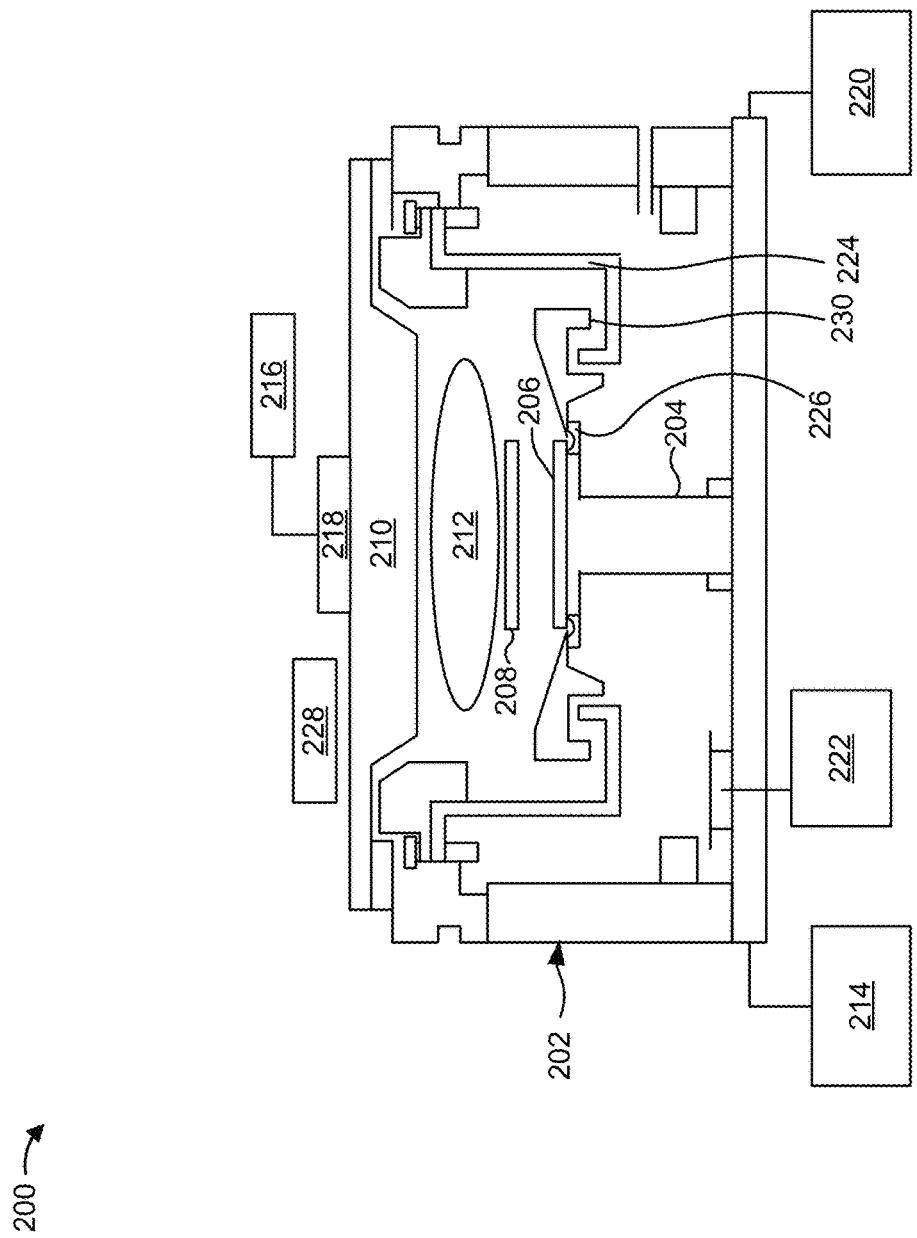
FIG. 2 is a diagram of an example deposition tool described herein for use in the semiconductor processing tool of FIG. 1.

FIG. 2 is a diagram of an example deposition tool 200 described herein for use in the semiconductor processing tool of FIG. 1. The deposition tool 200 may correspond to a PVD tool, a CVD tool, a sputtering tool, or another type of deposition tool. Furthermore, the deposition tool 200 may perform a semiconductor manufacturing process (e.g., a deposition process) when manufacturing semiconductor product. Furthermore, the deposition tool 200 may perform a conditioning process to maintain a degree of cleanliness of the deposition tool 200.

The deposition tool 200 includes a processing chamber 202 which may correspond to one of the processing chambers 110-122 as described in connection with FIG. 1. The deposition tool 200 further includes a substrate support component 204 (e.g., an electrostatic chuck (ESC) or another type of substrate support component) upon which a semiconductor substrate 206 (e.g., a semiconductor wafer) is positioned and secured. In some implementations, the substrate support component 204 includes a heating component (e.g., a hot plate, among other examples) to provide heat to the semiconductor substrate 206 during the deposition process and/or the conditioning process. The substrate support component 204 may be, for example, fabricated from aluminum, stainless steel, ceramic, or combinations thereof.

The deposition tool 200 further includes a shutter disc 208. The shutter disc 208 is an approximately round or an approximately disc-shaped component that is used in a conditioning process in the processing chamber 202. The composition and dimensions of the shutter disc 208 are further described herein in connection with FIGS. 4, 5A, 5B, and 6. During the conditioning process, a rotating arm or other component (e.g., the robotic arm 128) may position the shutter disc 208 onto or over surfaces of the substrate support component 204 in place of the semiconductor substrate 206. During the conditioning process, the shutter disc 208 protects the substrate support component 204 and one or more other components adjacent to and/or around the substrate support component 204 from particulates or contaminants that may be generated in the conditioning process.

In some implementations, the deposition tool 200 includes a target 210. The target 210 may include a material in solid form that is to be deposited on the semiconductor substrate 206. A plasma 212 may be formed from a gas (e.g., argon (Ar) or another chemically inert gas, among other examples) and supplied between the target 210 and the semiconductor substrate 206. One or more electrical biases may be applied to the target 210 and/or the semiconductor substrate 206. An electrical bias may be applied to the target 210 to cause ions in the plasma 212 to accelerate towards the target 210 to sputter etch the target 210. This causes material of the target 210 to be dislodged and mobilized. An electrical bias may be applied to the substrate support component 204 to generate an electrical potential or electric field between the target 210 and the semiconductor substrate 206. This promotes or facilitates a flow of the material that was dislodged from the target 210 toward the semiconductor substrate 206.

An example of a biasing power source that may be included in the deposition tool 200 includes a radio frequency (RF) power circuit 214. The RF power circuit 214 generates an RF bias voltage within the processing chamber 202. In some implementations, the RF power circuit 214 is connected to the substrate support component 204 to provide the RF bias voltage. The RF bias voltage may promote or facilitate a flow of the material that was dislodged from the target 210 toward the semiconductor substrate 206. Another RF bias voltage may be used to generate the plasma 212 and/or accelerate ions in the plasma 212 toward the target 210.

Another example of a biasing power source that may be included in the deposition tool 200 includes a direct current (DC) power circuit 216. The DC power circuit 216 generates DC power in the form of a DC bias voltage within the processing chamber 202. In some implementations, the DC power circuit 216 is connected to the target 210 using an electrode 218 and provides the target 210 with the DC bias voltage.

In some implementations, the deposition tool 200 includes a gas supply 220 that supplies one or more gases used to form plasmas (e.g., the plasma 212 used for the deposition process or another plasma used for the conditioning process, among other examples). The gas supply 220 may control a rate of flow of the gas, which controls one or more parameters of the plasma 212 including the ionization rate in the plasma 212, the ion passivation rate on the semiconductor substrate 206, and/or another parameter.

The deposition tool 200 further includes a vacuum pump 222. The vacuum pump 222 is connected to the deposition tool 200. The vacuum pump 222 is configured to create a vacuum state in the processing chamber 202 during the deposition process and/or the conditioning process.

The deposition tool 200 further includes a lower shield 224 and a platen ring 226. The lower shield 224 may shield the semiconductor substrate 206 during the deposition process and shield the shutter disc 208 during the conditioning process. The platen ring 226 may assist maintaining a position of the semiconductor substrate 206 during the deposition process and assist maintaining a position of the shutter disc 208 during the conditioning process. The platen ring 226 may be fabricated from a material that can resist erosion by the generated plasma 212, for example, a metallic material such as stainless steel, titanium, or aluminum, or a ceramic material such as aluminum oxide. However, another suitable material may be used such as a synthetic rubber, a thermoset, a plastic, a thermoplastic, or any other material that meets a chemical compatibility, durability, sealing, and/or temperature requirement of the deposition process and/or the conditioning process.

The deposition tool 200 further includes a magnet 228. In some implementations, the magnet 228 enhances uniform consumption of the target material during the deposition process. The magnet 228 may also promote uniform cleaning of the target 210 during the conditioning process.

In some implementations, the deposition tool 200 includes an upper shield 230. The upper shield 230 is positioned adjacent to the lower shield 224. The upper shield 230 may be supported by the lower shield 224. The lower shield 224 and the upper shield 230 cooperate to reduce or eliminate materials from the target 210 from coming in contact with components (e.g., the substrate support component 204) of the deposition tool 200. The lower shield 224 and the upper shield 230 may be fabricated from a material that can resist erosion by the generated plasma 212, such as a stainless-steel material, a titanium material, an aluminum material, or a ceramic material, among other examples.

As indicated above, FIG. 2 is provided as an example. Other examples may differ from what is described with regard to FIG. 2. For example, another example may include additional components, fewer components, different components, or differently arranged components than those shown in FIG. 2. Additionally, or alternatively, a set of components (e.g., one or more components) of FIG. 2 may perform one or more functions described herein as being performed by another set of components.

Figure 3:
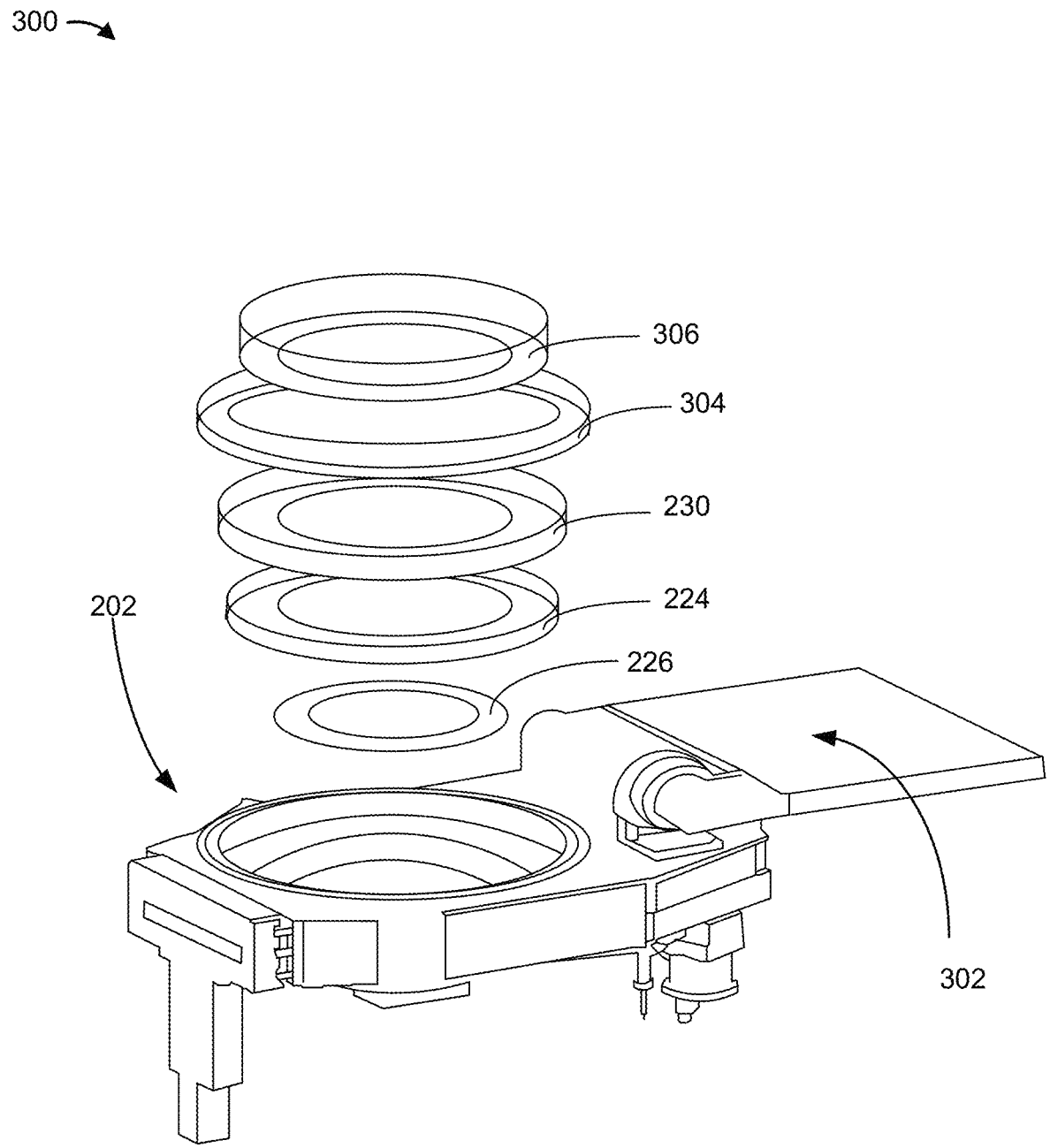
FIG. 3 is a diagram of an exploded view of an example processing chamber described herein.

FIG. 3 is diagram of an exploded view of an example implementation 300 of the processing chamber 202 described herein (e.g., the processing chambers 110-122). The processing chamber 202 includes a lid 302 attached to the processing chamber 202. The lid 302 seals the processing chamber 202 to allow an environment in the processing chamber 202 to be controlled (e.g., control the vacuum state within the processing chamber 202, among other examples).

The processing chamber 202 further includes a combination of shields and rings. The shields and rings may shield or position the semiconductor substrate 206 during the deposition process. The same shields and rings may also shield or position the shutter disc 208 during the conditioning process.

In some implementations, the processing chamber 202 includes the platen ring 226. The platen ring 226 may be fabricated from a material that can resist erosion by the generated plasma 212, for example, a metallic material such as stainless steel, titanium, or aluminum, or a ceramic material such as aluminum oxide. However, another suitable material may be used such as a synthetic rubber, a thermoset, a plastic, a thermoplastic, or any other material that meets a chemical compatibility, durability, sealing, and/or temperature requirement of the deposition process and/or the conditioning process. The platen ring 226 may assist retaining the semiconductor substrate 206 during the deposition process. The platen ring 226 may also assist retaining the shutter disc 208 during the conditioning process.

In some implementations, the processing chamber 202 includes the lower shield 224 and the upper shield 230. The lower shield 224 and the upper shield 230 may be fabricated from a material that can resist erosion by the generated plasma 212, such as a stainless-steel material, a titanium material, an aluminum material, or a ceramic material, among other examples.

In some implementations, the processing chamber 202 includes a cathode seat flange 304 and an earth shield 306. The cathode seat flange 304 may be electrically isolated from other parts of the processing chamber 202 to provide an electrical terminal (e.g., the electrode 218) to provide an electrical field in the processing chamber 202. The earth shield 306 may provide electrical shielding for the electrical field generated by the cathode seat flange 304.

As indicated above, FIG. 3 is provided as an example. Other examples may differ from what is described with regard to FIG. 3. For example, in some implementations, a different stacking or ordering of the various shields and rings is contemplated beyond the stacking and ordering of those illustrated with respect to FIG. 3.

Figure 4:
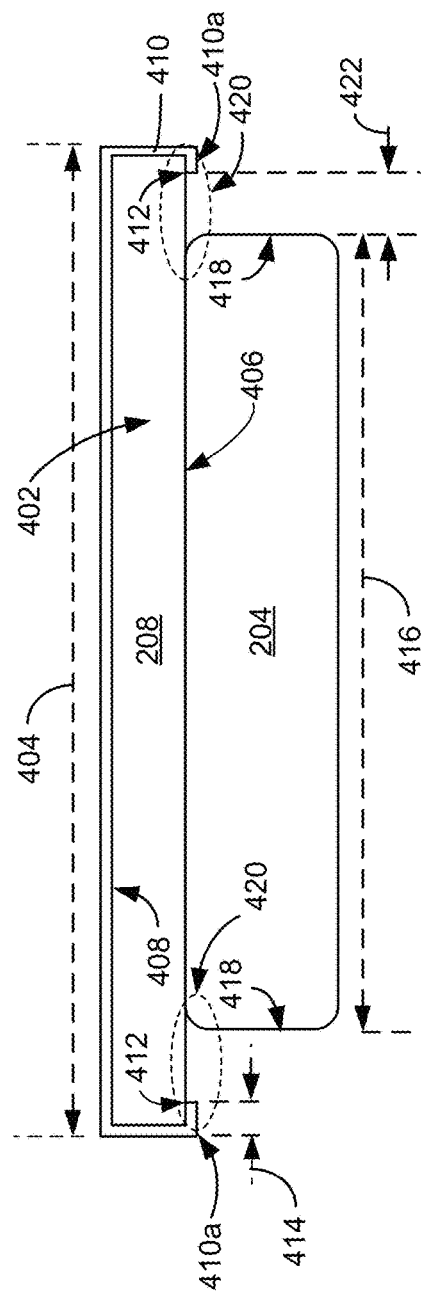
FIG. 4 is a diagram of an example implementation of the shutter disc in an example deposition tool described herein.

FIG. 4 is a diagram of an example implementation 400 of the shutter disc 208 described herein. As shown in FIG. 4, the shutter disc 208 may be positioned on the substrate support component 204, which may be included in the processing chamber 202 of the deposition tool 200. The shutter disc 208 is configured to prevent the particulates generated by the conditioning process from accumulating on (or being deposited onto) surfaces of the substrate support component 204.

The shutter disc 208 includes a body 402. The body 402 may include a material that has a relatively low thermal conductivity to reduce and/or minimize thermal stress of the shutter disc 208 and to reduce and/or minimize cracking and other physical damage to the shutter disc 208. Moreover, the material may include a high strength and/or a low density to further resist thermal stress and cracking of the shutter disc 208. Examples of such a material include a titanium (Ti) material having a thermal conductivity in a range of approximately 16 watts per meter-Kelvin (w/mK) to approximately 17 w/mK, a titanium alloy such as Ti-6Al-4V having a thermal conductivity in a range of approximately 6 w/mK to approximately 7 w/mK, a ceramic/steel material, and/or a ceramic/steel alloy material, among other examples. The material may further include one or more of a high temperature resistance, a low temperature resistance, a strong acid resistance or a strong alkali resistance, a high strength, and/or a low density. In some implementations, the body 402 is formed from a single piece of a material or a combination of materials.

The body 402 of the shutter disc 208 may be an approximate circular shape (or an approximate disc shape), and may include a diameter 404. The diameter 404 may be included in a range of greater than approximately 305 millimeters (mm) to approximately 310 mm. By selecting the diameter 404 within this range, the shutter disc 208 may prevent particulates associated with the conditioning process from accumulating on surfaces of the substrate support component 204 (e.g., an electrostatic chuck or a hot plate of the substrate support component 204, among other examples) while not disrupting the plasma used as part of the conditioning process. However, other values for the diameter 404 of the shutter disc 208 are within the scope of the present disclosure.

The body 402 further includes a backside (or bottom) surface 406 and a top surface 408. While the body 402, the backside surface 406, and the top surface 408 are illustrated in FIG. 4 as having an approximately flat and planar shape, the body 402 (or a portion thereof), the backside surface 406 (or a portion thereof), and/or the top surface 408 (or a portion thereof) of the shutter disc 208 may be wave-shaped along a cross section of the shutter disc 208 (e.g., in a cross section along the diameter 404), as described in greater detail herein.

The shutter disc 208 further includes a thin-film material 410 on one or more portions of the shutter disc 208. As an example, the thin-film material 410 (e.g., an aluminum (Al) material) may be included on the top surface 408 (or a portion thereof) of the shutter disc 208. As another example, the thin-film material 410 may be included on the backside surface 406 (or a portion thereof) of the shutter disc 208. As another example, the thin-film material 410 wraps around edges of the body 402 and onto the backside surface 406 of the shutter disc 208. The thin-film material 410 may include a metallic material, such as an aluminum material or an aluminum alloy material. In some implementations, a thickness of the thin-film material 410 is in a range of 240 microns to approximately 260 microns. However, other values for the range are within the scope of the present disclosure.

As shown in FIG. 4, a configuration of the thin-film material 410 includes a portion 410a on an outer region of the backside surface 406. The portion 410a includes an approximately annular shape or ring shape that conforms to the shape of a perimeter or outer edge of the backside surface 406. The portion 410a of the thin-film material 410 on the outer region of the backside surface 406 includes an inner edge 412 closet to the substrate support component 204. Also as shown in FIG. 4, the shutter disc 208 includes an untreated interior region of the backside surface 406 (e.g., a region of the backside surface 406 that is not coated with the thin-film material 410). The untreated interior region may extend from a center of the shutter disc 208 on the backside surface 406 to the inner edge 412 of the portion 410a of the thin-film material 410 on the backside surface 406 such that a space or a gap is provided between the substrate support component 204 and the inner edge 412 of the portion 410a of the thin-film material 410.

The portion 410a of the thin-film material 410 on the outer region of the backside surface may have a width 414. The width 414 may be dependent on the diameter 404. As an example, if the diameter 404 is approximately 305 mm, the width 414 may be in a range from approximately 1.0 mm to approximately 2.5 mm.

Also as shown in FIG. 4, the substrate support component 204 (e.g., the electrostatic chuck or hot plate of the substrate support component 204) has a diameter 416. In some implementations, the diameter 416 is included in a range of approximately 285 mm to approximately 295 mm. By selecting the diameter 416 within this range, the substrate support component 204 may adequately support a semiconductor substrate (e.g., the semiconductor substrate 206) that is approximately 300 mm in width during a deposition process without disrupting a plasma used during the deposition process (e.g., the plasma 212). However, other values for the diameter 416 of the substrate support component 204 are within the scope of the present disclosure.

The substrate support component 204 has an outer edge 418. When the shutter disc 208 is positioned on the substrate support component 204, a spacing 420 (e.g., a gap) is provided between the inner edge 412 and the outer edge 418. The spacing 420 has a width 422. In some implementations, the diameter 404 of the shutter disc 208 is configured such that the width 414 of the portion 410a of the thin-film material 410 on the outer region of the backside surface 406 of the shutter disc 208 is less than the width 422 of the spacing 420 between the inner edge 412 of the thin-film material 410 and the outer edge 418 of the substrate support component 204. Moreover, the diameter 404 of the shutter disc 208 may be configured such that the width 422 of the spacing 420 is in a range of approximately 3.0 mm to approximately 5.0 mm. Selecting the width 422 within this range may prevent fusing of a material (e.g., the particulates or another material) between the inner edge 412 and the outer edge 418 during the conditioning process. As another example, selecting the width 422 within this range may prevent mechanical interferences between the inner edge 412 and the substrate support component 204 during placement of the shutter disc 208 on the substrate support component 204, thereby preventing a tilting of the shutter disc 208 that allows the particulates of the conditioning process to migrate under the shutter disc 208 and onto surfaces of the substrate support component 204. As another example, selecting the width 422 within this range may prevent thermal contact between the thin-film material 410 and the substrate support component 204, thereby reducing heat transfer from the substrate support component 204 to the thin-film material 410 during the conditioning process that may cause cracking (e.g., thermal damage) to the shutter disc 208. As another example, selecting the width 422 within this range may prevent a reflow of the thin-film material 410 (e.g., an aluminum material) onto the substrate support component 204 in the event the substrate support component 204 includes a hot plate. However, other values for the width 422 of the spacing 420 are within the scope of the present disclosure. In some implementations, the width 422 is greater than approximately 5.0 mm.

In some implementations, the diameter 404 of the shutter disc 208 is included in a range of greater than 10 mm greater than the diameter 416 of the substrate support component 204 to approximately 20 mm greater than the diameter 416 of the substrate support component 204. By selecting the diameter 404 of the shutter disc 208 within this range allows the width 422 of the spacing 420 to be increased to reduce a likelihood of reflow of the thin-film material 410 onto the substrate support component 204 (e.g., a hot plate). However, other values for the diameter 404 of the shutter disc 208 are within the scope of the present disclosure.

As indicated above, FIG. 4 is provided as an example. Other examples may differ from what is described with regard to FIG. 4.

Figure 5A:
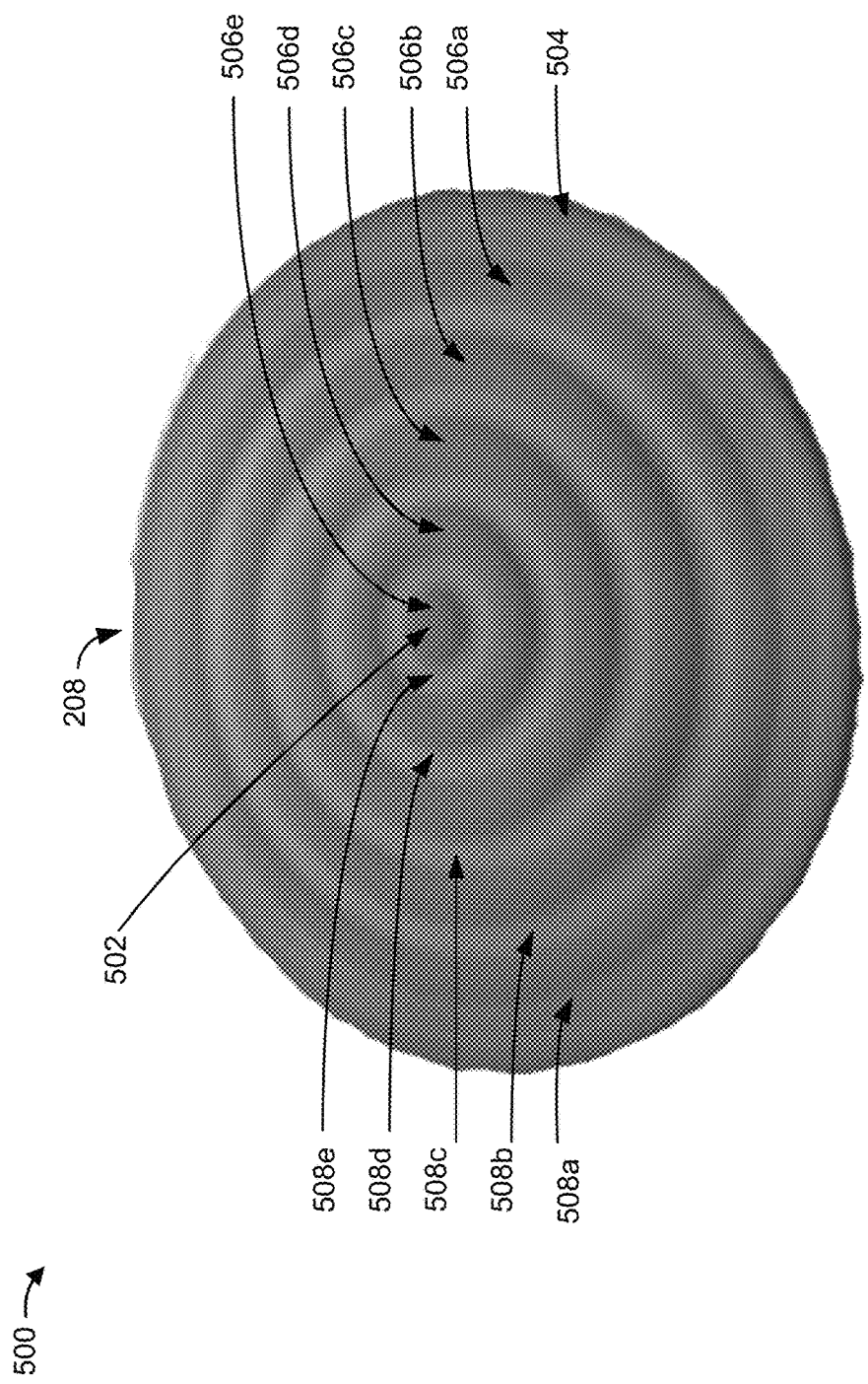
FIGS. 5A and 5B are diagrams of an example implementation of the shutter disc for the deposition tool of FIG. 2 described herein.
Figure 5B:
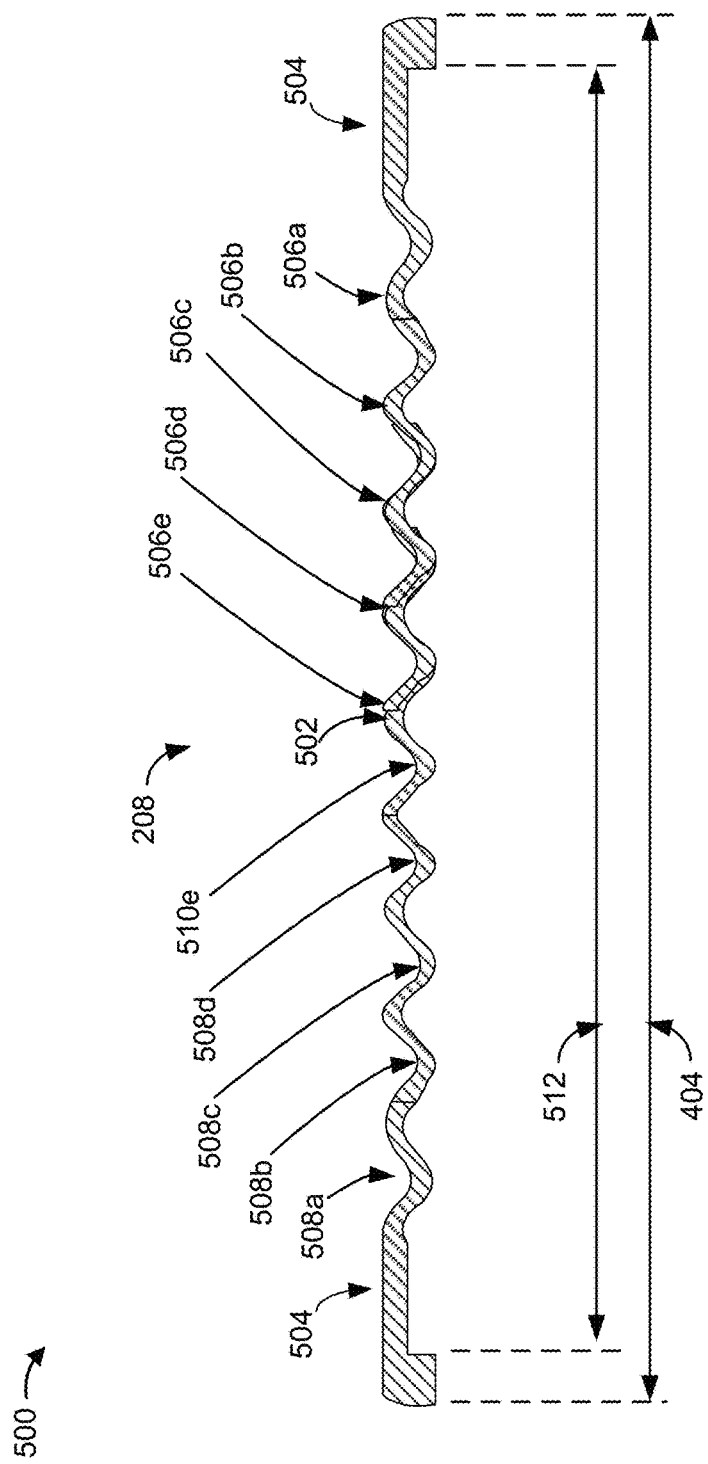

FIGS. 5A and 5B are diagrams of an example implementation 500 of the shutter disc 208 for the deposition tool 200 of FIG. 2 described herein.

FIG. 5A shows an isometric view of shutter disc 208. As shown in FIG. 5A, the shutter disc 208 disc includes a center 502 and an outer edge 504. A plurality of concentric crest portions 506a-506e of wave shapes extend between the center 502 and the outer edge 504. Furthermore, a plurality of concentric trough portions 508a-508e of wave shapes extend between the center 502 and the outer edge 504. The plurality of concentric crest portions 506a-506e and the plurality of concentric trough portions 508a-508e combine to form a plurality of concentric wave shapes that extend between the center 502 and the outer edge 504.

A thermal contact area between the shutter disc 208 and the substrate support component 204 may be formed when the shutter disc 208 is positioned on the substrate support component 204. The substrate support component 204 may be heated in a conditioning process to a temperature that is in a range of approximately 295 degrees Celsius to approximately 305 degrees Celsius (however, other temperatures are within the scope of the present disclosure). The amount of heat that is transferred from the substrate support component 204 to the shutter disc 208 in a conditioning process is dependent upon a size of the thermal contact area between the shutter disc 208 and the substrate support component 204. In comparison to a shutter disc that has a flat or linear surface, the plurality of concentric wave shapes reduce the thermal contact area between the shutter disc 208 and the substrate support component 204. The reduced thermal contact area reduces the amount of heat that is transferred to the shutter disc 208 from the substrate support component 204 during the conditioning process.

In this way, the plurality of concentric wave shapes may provide stress relief for the shutter disc 208 by reducing the amount of thermal stress on the shutter disc 208 as a result of repeated thermal cycling (e.g., heating and cooling) of the shutter disc 208 in a plurality of conditioning processes. In particular, the plurality of concentric wave shapes reduce thermal stress by reducing thermal expansion and contraction of the shutter disc 208. Moreover, the plurality of concentric wave shapes provide increased structural rigidity for the body 402 of the shutter disc 208, which reduces bending of the shutter disc 208. As an example, a target allowable bending threshold may be less than approximately 0.5 millimeters.

The plurality of concentric wave shapes may reduce a likelihood of cracking and other physical damage of the shutter disc 208, which increases the reliability and the operational life of the shutter disc 208. As an example, the plurality of concentric wave shapes may increase the operational life of the shutter disc 208 from approximately 1000 kilowatt hours to approximately 1500 kilowatt hours or greater.

FIG. 5B shows a cross-section view of the example implementation 500. FIG. 5B shows the diameter 404 of the shutter disc 208. FIG. 5B further shows the cross-sectional wave shape of the body 402 of the shutter disc 208. The cross-sectional wave shape results from the plurality of concentric wave shapes (e.g., the combination of the plurality concentric crest portions 506a-506e and plurality of concentric trough portions 508a-508e). The cross-sectional wave shape (e.g., the plurality of concentric wave shapes) extends between the center 502 of the shutter disc 208 and the outer edge 504 of the shutter disc 208.

The outer edge 504 may be planar (e.g., include a planar region). Moreover, the cross-sectional wave shape may extend along a portion of the diameter 404 of the shutter disc 208 between opposing ends of the outer edge 504. As further shown in FIG. 5B, the plurality of concentric wave shapes may be included in the top surface 408 and the backside surface 406 of the body 402. Accordingly, the top surface 408 includes a plurality of concentric wave shapes and the backside surface 406 includes another plurality of concentric wave shapes.

Dimensions of each of the concentric crest portions 506a-506e may be approximately the same. Furthermore, dimensions of each of the concentric trough portions 508a-508e may be the same. Such dimensions (e.g., dimensions that are approximately the same) may create one or more subsets of wave shapes having same heights, same depths, same thicknesses, and same peak-to-peak widths.

Dimensions of each of the concentric crest portions 506a-506e may vary. Furthermore, dimensions of each of the concentric trough portions 508a-508e may vary. Such variations may create one or more subsets of wave shapes having different heights, different depths, different thicknesses, or different peak-to-peak widths.

In some implementations, and as shown in FIG. 5B, the shutter disc 208 is configured with an interior recess having a diameter 512. As an example, diameter 512 may range from approximately 270 mm to approximately 280 mm. Selecting the diameter 512 in this range, which may be based on other dimensions or parameters of the substrate support component 204 (e.g., the diameter 416 of the substrate support component 204), may allow the shutter disc 208 to "overlap" the substrate support component 204. Selecting the diameter 512 in this range may also accommodate a spacing (e.g., the spacing 420) that increases the performance and a reliability of the shutter disc 208. However, other values for the diameter 512 are within the scope of the present disclosure.

As indicated above, FIGS. 5A and 5B are provided as examples. Other examples may differ from what is described with regard to FIGS. 5A and 5B. For example, while a quantity of five concentric wave shapes are illustrated with respect to FIGS. 5A and 5B, a greater or lesser quantity is possible. As another example, a spiral wave shape, a patterned wave shape (e.g., a "waffle"), a plurality of square wave shapes, or plurality of dimple shapes, among other examples, may be substituted for the plurality of concentric wave shapes.

Figure 6:
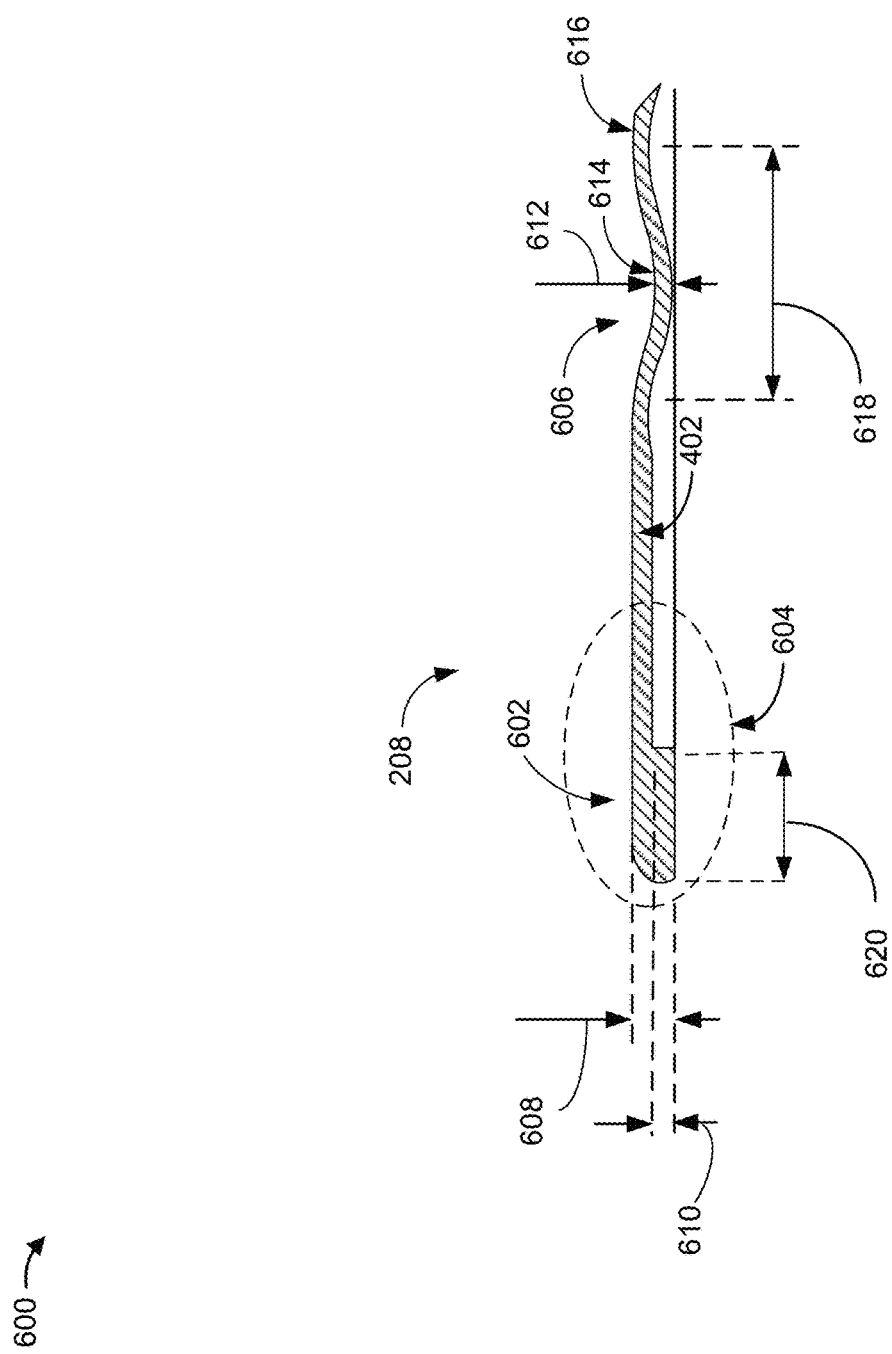
FIG. 6 is a diagram of an example implementation of a portion of the shutter disc for the deposition tool of FIG. 2 described herein.

FIG. 6 is a diagram of an example implementation 600 of a portion of the shutter disc 208 for the deposition tool 200 of FIG. 2 described herein. The example implementation 600 illustrates various dimensions of the shutter disc 208.

As shown in FIG. 6, the body 402 of the shutter disc 208 includes an approximately flat and planar section 602 at an outer region of the body 402. The planar section 602 may correspond to and/or may be included in an outer edge region 604. The body 402 of the shutter disc 208 also includes a cross-sectional wave shape section 606 between a center (e.g., the center 502) of the body 402 and the approximately flat and planar section 602. The cross-sectional wave shape section 606 (e.g., a plurality of concentric waves formed using the cross-sectional wave shape section 606) may extend between a center of the shutter disc 208 (e.g., the center 502) and an edge of the shutter disc 208 (e.g., the outer edge 504).

In some implementations, a thickness 608 of the body 402 is included in a range of approximately 4.5 mm to approximately 5.5 mm. By selecting the thickness 608 within this range, stress distribution with the body 402 during the conditioning process may be such that the shutter disc 208, including the body 402, does not deform or warp. However, other values for the thickness 608 of the body 402 are within the scope of the present disclosure.

The body 402 may be recessed to a depth 610. As an example, and for forming (e.g., stamping or milling, among other examples) one or more of the cross-sectional wave shape section(s) 606, the depth may be included in a range of approximately 2.5 mm to approximately 3.5 mm. By selecting the depth 610 within this range, the cross-sectional wave shape section(s) 606 may be formed to targeted contours, curvatures, and/or shapes.

As shown in FIG. 6, and in some implementations, the cross-sectional wave shape section 606 may include a thickness 612. The thickness 608 of the body 402 in the planar section 602 may be greater relative to the thickness 612 of the body 402 in the cross-sectional wave shape section 606. The thickness 612 may be included in range of approximately 1.7 mm to approximately 2.0 mm between a top surface of the body 402 and a backside surface of the body 402. By selecting the thickness 612 of the cross-sectional wave shape section 606 within this range, a balance between a rigidity that prevents the shutter disc 208, including the body 402, from warping during the conditioning process and a rigidity that allows forming of the cross-sectional wave shape section 606 may be attained. However, other values for the thickness 612 of the body 402 of the cross-sectional wave shape section 606 are within the scope of the present disclosure.

Other portions of the shutter disc 208 not including the cross-sectional wave shape section 606 may have one or more thicknesses in a range of approximately 1.5 to 2.0 mm to reduce a weight of the shutter disc 208.

FIG. 6 further shows a trough 614 and a crest 616 of the cross-sectional wave shape section 606. In some implementations, a relative positional relationship of the trough 614 to the crest 616 is such that a top surface of the trough 614 is approximately equal to or below a backside surface of the crest 616. Such a relative positional relationship may be applicable to one or more of a plurality of concentric wave shapes.

The cross-sectional wave shape section 606 may have a peak-to-peak width 618 (e.g., a peak-to-peak width between two of the crests 616). As an example, the peak-to-peak width 618 may be in a range from approximately 30.0 mm to approximately 31.0 mm. However, other values for the peak-to-peak width 618 are within the scope of the present disclosure.

The planar section 602 may have a width 620. As an example, the width 620 may be in a range from approximately 28.7 mm to approximately 29.7 mm. Selecting the width 620 of the planar section 602 within this range may enable a robotic arm (e.g., the robotic arm 128) to place the shutter disc 208 on a substrate support component (e.g., the substrate support component 204). However, other values for the width 620 are within the scope of the present disclosure.

In some implementations, the body 402 includes a combination of one or more pluralities of a plurality of concentric wave shapes. For example, a top surface of the body 402 (e.g., the top surface 408) may include a first plurality of the concentric wave shapes, while a bottom (e.g., the backside surface 406) may include a second (different) plurality of concentric wave shapes.

As indicated above, FIG. 6 is provided as an example. Other examples may differ from what is described with regard to FIG. 6.

Figure 7:
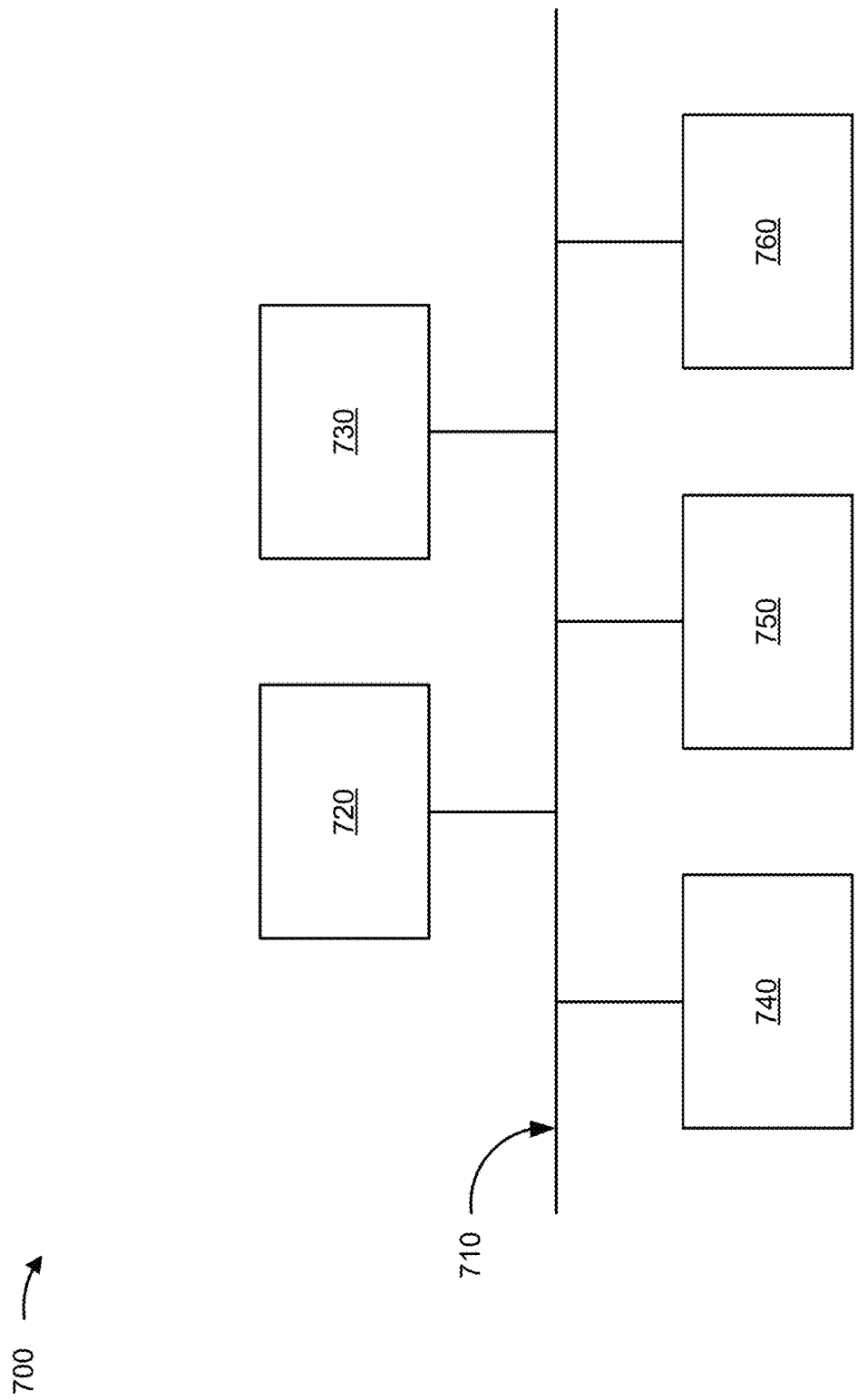
FIG. 7 is a diagram of example components of one or more devices of FIGS. 1 and 2 described herein.

FIG. 7 is a diagram of example components of one or more devices of FIGS. 1 and 2 described herein. In some implementations, the semiconductor substrate transfer system 126, the plurality of robotic arms 128, the processing chamber 202, and/or the substrate support component 204 include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

As indicated above, FIG. 7 is provided as an example. Other examples may differ from what is described with regard to FIG. 7.

Figure 8:
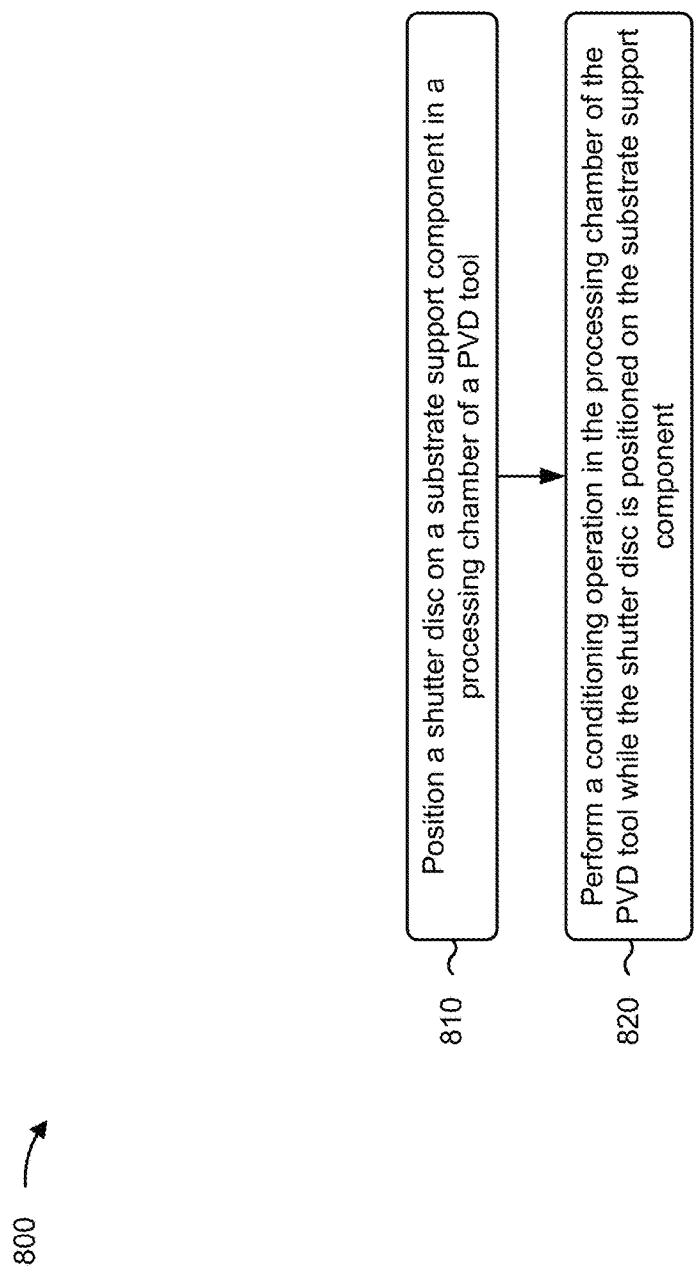
FIG. 8 is a flowchart of an example process associated with performing a conditioning operation in a processing chamber using a shutter disc described herein.

FIG. 8 is a flowchart of an example process 800 associated with performing a conditioning operation in a processing chamber using a shutter disc described herein. In some implementations, one or more process blocks of FIG. 8 are performed by a semiconductor processing tool (e.g., the semiconductor processing system 100). In some implementations, one or more process blocks of FIG. 8 are performed by another device or a group of devices separate from or including the semiconductor processing system 100, such as the semiconductor substrate transfer system 126, the plurality of robotic arms 128, the processing chamber 202, and/or the substrate support component 204. Additionally, or alternatively, one or more process blocks of FIG. 8 may be performed by one or more components of device 700, such as processor 720, memory 730, input component 740, output component 750, and/or communication component 760.

As shown in FIG. 8, process 800 may include positioning a shutter disc on a substrate support component in a processing chamber of a PVD tool (block 810). For example, the semiconductor substrate transfer system 126 may position a shutter disc 208 on a substrate support component 204 in a processing chamber 202 of a PVD tool, as described above. In some implementations, a width 414 of a portion of a thin-film material 410 on an outer region of a backside surface 406 of the shutter disc 208 is less than a width 422 of a space 420 between an inner edge 412 of the thin-film material 410 and an outer edge of the substrate support component 204.

As further shown in FIG. 8, process 800 may include performing a conditioning operation in the processing chamber of the PVD tool while the shutter disc is positioned on the substrate support component (block 820). For example, the semiconductor processing system 100 may perform the conditioning operation in the processing chamber 202 of the PVD tool while the shutter disc 208 is positioned on the substrate support component 204, as described above.

Process 800 may include additional implementations, such as any single implementation or any combination of implementations described below and/or in connection with one or more other processes described elsewhere herein.

In a first implementation, positioning the shutter disc 208 includes positioning the shutter disc on the substrate support component 204 such that a spacing 420 between the inner edge 412 of the thin-film material 410 and an outer edge 418 of the substrate support component 204 is in a range of approximately 3 millimeters (mm) to approximately 5 mm.

In a second implementation, alone or in combination with the first implementation, process 800 includes positioning at least one of a platen ring 226, a lower shield 224, or an upper shield 230 over the shutter disc 208 to reduce contamination of the substrate support component.

In a third implementation, alone or in combination with one or more of the first and second implementations, the substrate support component 204 includes a hot plate or an electrostatic chuck.

In a fourth implementation, alone or in combination with one or more of the first through third implementations, the shutter disc 208 includes a top surface 408, and where the top surface 408 includes a cross-sectional wave shape section 606 that extends between a center of the shutter disc 208 and an outer edge of the shutter disc 208.

In a fifth implementation, alone or in combination with one or more of the first through fourth implementations, the shutter disc 208 includes a body 402 including an approximate disc shape, where the body includes an approximately flat and planar section 602 at an outer edge region 604 of the body 402, and a cross-sectional wave shape section 606 between a center of the body 402 and the approximately flat and planar section 602.

In a sixth implementation, alone or in combination with one or more of the first through fifth implementations, a thickness 608 of the approximately flat and planar section 602 is greater than a thickness of the cross-sectional wave shape section 606.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Using techniques described above may increase effectiveness of the shutter disc preventing particulates from being deposited or transferred onto one or more surfaces of the substrate support component during the conditioning process. Furthermore, the techniques may reduce a likelihood of the shutter disc cracking during the conditioning process. In this way, effectiveness of the conditioning process is improved. The improvement in the conditioning process may reduce chucking errors experienced by the PVD tool and reduce a frequency of maintenance operations for the PVD tool, effective to increase operating efficiency and throughput of the PVD tool. Furthermore, and in addition to realizing a savings in maintenance costs due to a decreased rate of shutter disc replacement, a yield of integrated circuit devices fabricated using the PVD tool may increase.

As described in greater detail above, some implementations described herein provide a method. The method includes positioning a shutter disc on a substrate support component in a processing chamber of a PVD tool, where a width of a portion of a thin-film material on an outer region of a backside surface of the shutter disc is less than a width of a space between an inner edge of the thin-film material and an outer edge of the substrate support component. The method includes performing a conditioning operation in the processing chamber of the PVD tool while the shutter disc is positioned on the substrate support component.

As described in greater detail above, some implementations described herein provide a shutter disc for use in a PVD processing chamber. The shutter disc includes a body including an approximately circular shape. The shutter disc includes a top surface of the body, where the top surface includes a plurality of concentric wave shapes.

As described in greater detail above, some implementations described herein provide a deposition tool. The deposition tool includes a processing chamber. The deposition tool includes a substrate support component included in the processing chamber. The deposition tool includes a shutter disc included on the substrate support component, where the shutter disc includes a plurality of concentric wave shapes that includes one or more wave-shaped sections.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A shutter disc for use in a physical vapor deposition (PVD) processing chamber, comprising:
   a body, comprising:
      a portion having a cross-sectional wave-shape and comprising:
         a plurality of concentric crest portions, and
         a plurality of concentric trough portions,
            wherein a top surface of at least one concentric trough portion, of the plurality of concentric trough portions, is at an equal height with or below a backside surface of at least one concentric crest portion of the plurality of concentric crest portions.

2. The shutter disc of claim 1, wherein a peak-to-peak width of the plurality of concentric crest portions is in a range from approximately 30.0 mm to approximately 31.0 mm.

3. The shutter disc of claim 1, wherein the body further comprises a planar section at an outer region of the body.

4. The shutter disc of claim 3, wherein a thickness of the body in the planar section is greater than a thickness of the body in the portion having the cross-sectional wave-shape.

5. The shutter disc of claim 1, wherein a thickness of the body is in a range of approximately 4.5 mm to approximately 5.5 mm.

6. The shutter disc of claim 1, wherein the body further comprises a recess.

7. A deposition tool comprising:
a processing chamber;
a substrate support component included in the processing chamber; and
a shutter disc included on the substrate support component,
wherein the shutter disc comprises:
one or more wave-shaped sections, and
a thin-film material on an outer region of a backside surface of the shutter disc,
wherein a width of a spacing between an inner edge of the thin-film material and an outer edge of the substrate support component is included in a range of approximately 3 millimeters (mm) to approximately 5 mm.

8. The deposition tool of claim 7, wherein the shutter disc further comprises a planar section.

9. The deposition tool of claim 7, wherein the shutter disc further comprises the thin-film material on a top surface of the shutter disc.

10. The deposition tool of claim 9, wherein the shutter disc further comprises:
a body,
wherein the thin-film material wraps around an edge of the body and onto the backside surface.

11. The deposition tool of claim 7, wherein the one or more wave-shaped sections comprises a plurality of concentric wave shapes.

12. The deposition tool of claim 11, wherein a peak-to-peak width of the plurality of concentric wave shapes is in a range from approximately 30.0 mm to approximately 31.0 mm.

13. The deposition tool of claim 7, wherein the one or more wave-shaped sections comprises:
a plurality of concentric crest portions, and
a plurality of concentric trough portions.

14. A shutter disc for use in a physical vapor deposition (PVD) processing chamber, comprising:
a body, comprising:
a wave-shaped region comprising a cross-sectional wave shape, and
a planar region,
wherein a thickness of the body in the planar region is greater than a thickness of the body in the wave-shaped region.

15. The shutter disc of claim 14, wherein a top surface of a trough portion in the wave-shaped region is below a backside surface of a crest in the wave-shaped region.

16. The shutter disc of claim 14, wherein a top surface of a trough portion in the wave-shaped region is equal in height with a backside surface of a crest in the wave-shaped region.

17. The shutter disc of claim 14, wherein a peak-to-peak width in the wave-shaped region is in a range from approximately 30.0 mm to approximately 31.0 mm.

18. The shutter disc of claim 14, wherein the wave-shaped region comprises a plurality of concentric wave shapes.

19. The shutter disc of claim 14, wherein a backside surface of the wave-shaped region comprises a plurality of concentric wave shapes.

20. The shutter disc of claim 14, wherein a top surface of the wave-shaped region comprises the cross-sectional wave shape, and a backside surface of the wave-shaped region comprises another cross-sectional wave shape.

* * * * *